United States Patent
Zota et al.

(10) Patent No.: US 11,270,999 B2
(45) Date of Patent: Mar. 8, 2022

(54) CAPACITORLESS DRAM CELL

(71) Applicant: International Business Machines Corporation, Armonk, NY (US)

(72) Inventors: Cezar Bogdan Zota, Ruschlikon (CH); Clarissa Convertino, Rueschlikon (CH); Lukas Czornomaz, Zurich (CH); Siegfried Friedrich Karg, Adliswil (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/224,258

(22) Filed: Apr. 7, 2021

(65) Prior Publication Data

US 2021/0225845 A1     Jul. 22, 2021

Related U.S. Application Data

(63) Continuation of application No. 16/703,916, filed on Dec. 5, 2019, now Pat. No. 11,031,402.

(51) Int. Cl.
*H01L 27/108* (2006.01)
*G11C 11/404* (2006.01)
*G11C 11/401* (2006.01)

(52) U.S. Cl.
CPC ...... *H01L 27/10802* (2013.01); *G11C 11/404* (2013.01); *G11C 11/401* (2013.01); *G11C 2211/4016* (2013.01); *H01L 27/108* (2013.01)

(58) Field of Classification Search
CPC .......... H01L 27/108; H01L 27/10802; G11C 11/401; G11C 11/404; G11C 2211/4016

USPC ........................................................ 365/182
See application file for complete search history.

(56) References Cited

U.S. PATENT DOCUMENTS

| | | | |
|---|---|---|---|
| 5,500,545 | A | 3/1996 | Cheng |
| 6,133,593 | A | 10/2000 | Boos |
| 8,014,195 | B2 | 9/2011 | Okhonin |
| 8,064,239 | B2 | 11/2011 | Ertosun |

(Continued)

FOREIGN PATENT DOCUMENTS

| | | |
|---|---|---|
| CN | 102376715 B | 3/2014 |
| CN | 103972174 B | 11/2018 |
| JP | 2012238763 A | 12/2012 |

OTHER PUBLICATIONS

"PCT Written Opinion of the International Search Authority", International application No. PCT/IB2020/060798, International filing date Nov. 17, 2020, dated Feb. 25, 2021, 8 pages.

(Continued)

*Primary Examiner* — Son L Mai
(74) *Attorney, Agent, or Firm* — William H. Hartwell; Stephen R. Yoder (57) ABSTRACT

The invention relates to a capacitorless DRAM cell, the cell comprising a heterostructure, a gate structure adjoining the heterostructure in a first direction, a drain structure adjoining the heterostructure in a second direction perpendicular to the first direction, and a source structure adjoining the heterostructure in the direction opposite the second direction, the heterostructure comprising one or more semiconducting channel layers and one or more electrically insulating barrier layers, the channel layers and the barrier layers being alternatingly stacked in the first direction.

20 Claims, 4 Drawing Sheets

(56) References Cited

U.S. PATENT DOCUMENTS

| | | | |
|---|---|---|---|
| 8,421,121 B2* | 4/2013 | Chou | H01L 29/7783 257/194 |
| 10,204,998 B2* | 2/2019 | Yang | H01L 29/66462 |
| 10,680,091 B2 | 6/2020 | Kushida | |
| 2009/0026519 A1 | 1/2009 | Jin | |

OTHER PUBLICATIONS

Ertosun, M. Gunhan, "Investigation of Capacitorless Double-Gate Single-Transistor DRAM: With and Without Quantum Well", IEEE Transactions on Electronic Devices, vol. 57, No. 3, Mar. 2010, © 2010, IEEE, 6 pages.

Ertosun, Mehmet Gunhan, "Novel Capacitorless Single-Transistor Dram Technologies", May 2010, A Dissertation submitted to the Department of Electrical Engineering and the Committee on Graduate Studies of Standford University, ©2010 by Mehmet Gunhan Ertosun, 136 pages.

IBM Appendix P, "List of IBM Patents or Patent Applications Treated as Related", Filed Herewith, 2 pages.

Navarro et al., "InGaAs Capacitor-Less DRAM Cells TCAD Demonstration", Journal of the Electron Devices Society, vol. 6, 2018, Date of current version Aug. 14, 2018, © 2018 IEEE, 9 pages.

Okhonin, S. et al., "A Capacitor-Less 1T-DRAM Cell", IEEE Electron Device Letters, vol. 23, No. 2, Feb. 2002, © 2002 IEEE, 3 pages.

Yoon, Young Jun, "Capacitorless One-Transistor Dynamic Random-Access Memory Based on Asymmetric Double-Gate Ge/Gaas-Heterojunction Tunneling Field-Effect Transistor With N-Doped Boosting Layer and Drain-Underlap Structure", Japanese Journal of Applied Physics 57, O4FG03 (2018), 6 pages.

Yu et al., "A Highly Scalable and Energy-Efficient 1T DRAM Embedding a SiGe Quantum Well Structure for Significant Retention Enhancement", © 2018 IEEE, 3 pages.

Zota et al., "Capacitorless DRAM Cell", U.S. Appl. No. 16/703,916, filed Dec. 5, 2019, 27 pages.

* cited by examiner

CAPACITORLESS DRAM CELL

BACKGROUND

The present invention relates to integrated semiconductor memory devices, and more specifically, to capacitorless dynamic random-access memory (DRAM) cells.

DRAM stores data as a positive or negative electrical charge in a capacitive structure. The structure providing the capacitance, as well as the transistors that control access to it, is collectively referred to as a DRAM cell. They are the fundamental building blocks in DRAM arrays. Multiple DRAM memory cell variants exist, but the most commonly used variant in modern DRAMs is the one-transistor, one-capacitor (1T1C) cell. The transistor is used to admit current into the capacitor during write operations, and to discharge the capacitor during read operations.

SUMMARY

In one aspect, the invention relates to a capacitorless DRAM cell. The cell comprises a heterostructure, a gate structure adjoining the heterostructure in a first direction, a drain structure adjoining the heterostructure in a second direction perpendicular to the first direction, and a source structure adjoining the heterostructure in the direction opposite the second direction. The heterostructure comprises one or more semiconducting channel layers and one or more electrically insulating barrier layers, with the channel layers and the barrier layers being alternatingly stacked in the first direction.

Embodiments of the capacitorless DRAM cell (in short, "the cell") may have advantages that arise from the heterostructure replacing the traditional MOSFET-type channel. While each channel layer can still be regarded as a volume of material that, depending on the configuration of voltages applied to the adjacent source, gate and drain structures, may allow either storage of electric charge carriers (electrons and/or holes) or their transport in the positive or negative second direction, each barrier layer is electrically insulating and may thus prevent transport of the charge carriers across the barrier layer, i.e., in the positive or negative first direction. Consequentially, each barrier layer may contribute to an increase of the retention time of electrons and/or holes by suppressing or impeding loss effects (e.g. through recombination or tunneling out of the heterostructure) that involve movement of charge carriers in the positive or negative first direction.

In an embodiment, the heterostructure comprises a single barrier layer and two channel layers. In combination with the alternating configuration of the channel and barrier layers in the heterostructure, this means that the barrier layer is separating the two channel layers into one channel layer facing the gate structure and one channel layer facing away from the gate structure. If, for instance, a negative voltage is applied to the gate structure, the gate structure becomes attractive for holes and repulsive for electrons, so one can refer to the channel layer facing the gate structure as a "hole channel" and to the channel layer facing away from the gate structure as an "electron channel". If, instead, a positive voltage is applied to the gate structure, the gate structure becomes attractive for electrons and repulsive for holes, so one can refer in this case to the channel layer facing the gate structure as an "electron channel" and to the channel layer facing away from the gate structure as a "hole channel".

In a further aspect, the invention relates to a method of manufacturing a capacitorless DRAM cell. The method comprises:

forming a heterostructure that comprises one or more semiconducting channel layers and one or more electrically insulating barrier layers, where the channel layers and the barrier layers are alternatingly stacked in a first direction;

forming a gate structure adjoining the heterostructure in the first direction;

forming a drain structure adjoining the heterostructure in a second direction perpendicular to the first direction; and forming a source structure adjoining the heterostructure in the direction opposite the second direction.

BRIEF DESCRIPTION OF THE SEVERAL VIEWS OF THE DRAWINGS

In the following, embodiments of the invention are explained in greater detail, by way of example only, making reference to the drawings in which.

DETAILED DESCRIPTION

The last decades have spawned significant research efforts to reduce the memory cell size of volatile memories such as DRAM. As of today, DRAM cells are becoming size-limited by their external capacitor. One promising approach to enable further miniaturization is to leave out the capacitor and use the blind capacitance of the transistor instead to store the charge carriers representing information. The transistor structures used in DRAM cells are typically derivatives of the metal-oxide-semiconductor field effect transistor (MOSFET) that implements a source structure, a channel structure and a drain structure arranged in a sequence, and a gate structure adjoining the channel structure.

Several candidates for such capacitorless one-transistor ("1T") DRAM cells, such as ARAM and MSDRAM, have been proposed. These devices use the so-called floating-body effect to inject holes and electrons into the channel by band-to-band tunneling when gate and drain or gate and source are subjected to bias voltages of opposite signs. During a subsequent retention time, a sufficient portion of the injected charge carriers remains in the channel and the cell state can be read out using a memory effect on the drain-to-source current flowing through the transistor. This promising concept has already been used to demonstrate functional 1T DRAM cells and is considered as one of merely a few ways forward for DRAM scaling.

Key challenges for this technology include increasing the hole retention time and increasing the drain-to-source current (or alternatively, reduce the required drive bias voltage). Another challenge is scalability—the total channel thickness cannot be highly scaled because recombination rates typically increase with charge carrier density.

Several designs of capacitorless DRAM cells have been demonstrated. As of today, increases of charge carrier retention times and drain-to-source current are desirable to reach a sufficient market viability.

For the sake of clarity, several terms used or conditions implied throughout the present disclosure will be defined in the following.

The materials used for the heterostructure of the capacitorless DRAM cell comprise semiconductors and insulators as well. Each semiconducting channel layer may be made of a pure (undoped) semiconductor, an intrinsic semiconductor (i-type, doped or undoped, having an equal number of excited electrons, n, and holes, p), or a doped semiconductor (having a dopant concentration of $10^{18}$ cm$^{-3}$ or less). Each insulating (non-conducting) barrier layer may be made of a material whose electrical conductivity cannot be increased using technologies such as doping or gating.

The capacitorless DRAM cell features a heterostructure that comprises channel layers and barrier layers that are alternatingly stacked in the first direction. The terms "stack", "stacked" and the like do not necessarily imply that the first direction coincides with verticality. In fact, it may be possible to stack the layers of the heterostructure upon each other in any first direction, including a horizontal direction.

The memory cell may be formed, but not necessarily, on a substrate such as a semiconductor wafer. In particular, the memory cell may be a semiconductor-on-insulator (SOI) device. If formed on a substrate, the substrate may be supplied with a bias voltage, i.e., the substrate may be used as a second gate or back gate. Similarly, the source structure, the gate structure, the drain structure and, if applicable, the substrate may be implemented with electrical contacts to enable a supply of (bias) voltage and/or establishing an electrical current, and may comprise any suitable known or future structure of materials, such as n-type doped semiconductors, p-type doped semiconductors, intrinsic or i-type semiconductors, metals, high-k or low-k dielectrics and/or insulators, that are respectively adapted for implementing a source, a gate, a drain and optionally a back gate of a field effect transistor.

The capacitorless DRAM cell may be operated as follows: Charge carriers residing in the channel layers of the heterostructure may encode at least the two states '1' and '0' of one bit of information. In a non-limiting, purely illustrative example, the write-'1' operation may comprise providing the gate structure with a negative voltage and the drain structure with a positive voltage, such that holes are injected by band-to-band tunneling into the channel layer or region facing the gate structure and electrons are injected by band-to-band tunneling into the channel layer or region facing away from the gate structure. The number of injected electrons is electrostatically coupled to the number of injected holes. The charge carriers stay in the heterostructure for some time due to the floating-body effect. In the example, the write-'0' operation comprises emptying the charge carriers from the heterostructure by a near-flat-band bias condition (i.e., setting the gate structure to a slightly positive voltage and the source and drain structures to zero voltage).

During read operation, a small drain bias is applied, and the drain current is measured. An excess of charge carriers inside the heterostructure in the '1' state results in an increase in the (absolute value of the) drain current compared to the current in the '0' state. In the example, the state '0' or '1' is likewise preserved by supplying the gate structure with a negative bias voltage. If the cell is implemented on a back gate, it would be set on a positive back-gate bias voltage throughout the example.

According to an embodiment, the heterostructure comprises a single barrier layer and a single channel layer. In combination with the alternating configuration of the channel and barrier layers in the heterostructure, this means that the barrier layer insulates the channel layer from either the gate structure or any structure adjoining the heterostructure on the side facing away from the gate structure. This may provide the benefit of an increased charge carrier retention time by suppressing spontaneous movement and/or tunneling of charge carriers out of the heterostructure and/or their spontaneous recombination with further charge carriers from any structures adjoining the heterostructure in the positive or negative first direction.

According to an embodiment, the heterostructure comprises two barrier layers and two channel layers. In combination with the alternating configuration of the channel and barrier layers in the heterostructure, this means that one of the barrier layers is separating the two channel layers from each other and the other one of the barrier layers is insulating either the barrier layer facing the gate structure from the gate structure or the barrier layer facing away from the gate structure from a further structure adjoining the heterostructure. This may have the advantage of an increased charge carrier retention time and/or improved capability of miniaturization due to the barrier layer separating the two channel layers, and a further increased charge carrier retention time by suppressing spontaneous movement and/or tunneling of charge carriers out of the heterostructure and/or their spontaneous recombination with further charge carriers from any structures adjoining the heterostructure in the positive or negative first direction. The configuration where one of the barrier layers is placed at said position facing away from the gate structure may be useful if the gate structure comprises an oxide layer or other insulating layer adjoining the heterostructure that already provides a substantial suppression of charge carrier migration out of the heterostructure.

According to an embodiment, the heterostructure comprises at least two barrier layers made of different barrier layer materials. The choice of the different barrier layer materials may include, but is not limited to, the materials mentioned herein as suitable for making barrier layers. Implementing barrier layers made of different barrier layer materials may provide the benefit of an improved capability to confine the movement of charge carriers in the heterostructure in the positive or negative first direction. More precisely, some or all of the barrier layers may be manufactured from a barrier layer material that suppresses said movement for one sort of charge carriers (i.e., either electrons or holes) more effectively than for the other.

This may be useful if it can be expected that, during operation of the cell, the sort of charge carriers to be selectively confined by a given barrier layer will typically be localized at the position of the barrier layer. For instance, if the cell is designed to keep the cell in its programmed state, i.e., to keep a set of injected charge carriers representing the '0' or '1' state inside the heterostructure, by supplying the gate structure with a negative voltage, it can be expected that any injected holes will move close to the gate structure, i.e., to the channel layer facing the gate structure, while the correspondingly injected electrons will move to the side of the heterostructure that is opposite the gate structure, i.e., to the channel layer facing away from the gate structure. In this example, it may be possible to keep the holes confined to their hole channel layer by providing between the gate structure and the hole channel layer a barrier layer that is selectively impenetrable for holes, and/or to keep the electrons confined to their electron channel layer by providing between any structure adjoining the heterostructure on the side opposite the gate structure and the electron channel layer a barrier layer that is selectively impenetrable for electrons. It may be possible that the particular choice of a selectively impenetrable barrier layer material depends on the material of which the respective channel layer to be insulated or any other structure adjoining the given barrier layer is made.

According to an embodiment, the heterostructure comprises at least two channel layers made of different channel layer materials. The choice of the different channel layer materials may include, but is not limited to, the materials mentioned herein as suitable for making channel layers. Implementing channel layers made of different channel layer materials may provide the possibility to design some or all of the channel layers with specific properties that are customized to one sort of charge carriers (i.e., either electrons or holes).

For instance, it may be possible to optimize a heterostructure featuring two channel layers toward an increased charge carrier mobility in each channel layer, i.e., choosing a channel layer material with a high electron mobility for one of the channel layers and a channel layer material with a high velocity of apparent hole migration for the other channel layer. This may increase the conductivity of the heterostructure in the positive or negative second direction, and thus increase the drain-to-source current of the cell. However, other criteria that may be specific or unspecific to the sort of charge carriers, such as spin properties influencing the charge carriers or crystal lattice properties facilitating compatibility to adjoining structures, may be taken into account for choosing suitable different channel layer materials.

Implementing different channel layers with charge carrier-specific properties may be useful if it can be expected that, during operation of the cell, the sort of charge carriers to be selectively stored within a given channel layer will typically be localized at the position of the channel layer. For instance, if the cell is designed to keep the cell in its programmed state, i.e., to keep a set of injected charge carriers representing the '0' or '1' state inside the heterostructure, by supplying the gate structure with a negative voltage, it can be expected that any injected holes will move close to the gate structure, i.e., to the channel layer facing the gate structure, while the correspondingly injected electrons will move to the side of the heterostructure that is opposite the gate structure, i.e., to the channel layer facing away from the gate structure. In this example, it may be possible to select a material with desired properties with respect to holes as the channel layer material for the channel layer facing the gate structure, and/or to select a material with desired properties with respect to electrons as the channel layer material for the channel layer facing away from the gate structure. It may be possible that the particular choice of a selectively optimized channel layer material depends on the material of which an adjoining barrier layer insulating the given channel layer or any other structure adjoining the given channel layer is made.

According to an embodiment, the different channel layer materials differ in band gap energy by at least 0.5 electron-volts. This may allow for optimizing some or all of the channel layers by band gap engineering. For instance, one may use the channel layer material having the lower band gap energy (or more generally, a comparably low band gap energy or, in other words, a comparably narrow band gap) for implementing a channel layer that is dedicated for hole transport, as a narrower band gap may increase the apparent hole transport rate due to tunneling. This may result in shorter times for injecting and clearing holes from the dedicated hole channel layer, and hence increase the read/write cycle times of the cell.

According to an embodiment, the different channel layer materials differ in electron mobility by at least a factor of 10. This may allow for dedicating one or more of the channel layers (namely, those having the higher electron mobility) for implementing a channel layer that is dedicated for electron transport. This may increase the drain-to-source current of the cell as it may be used e.g. during readout.

According to an embodiment, the gate structure is adjoining one of the barrier layers. In this way, the channel layer(s) of the heterostructure may be insulated from the gate structure such that the buildup of gate currents may be prevented. It should be noted that, in this case of a barrier layer adjoining the gate structure, it may be unnecessary to provide the gate structure with a gate insulator layer (e.g., an oxide layer) as this is typically done throughout FET manufacturing today. This may provide a simplification to the manufacturing process of the capacitorless DRAM cell. Furthermore, this may prevent or hinder charge carriers from spontaneously moving or tunneling out of the heterostructure into the gate structure and/or spontaneous recombination with charge carriers from the gate structure.

According to an embodiment, the gate structure comprises a gate insulator layer adjoining the barrier layer. A gate insulator layer may be made of an electrical insulator such as an oxide and may prevent an exchange of charge carriers between the heterostructure and the gate structure to enable control of the charge carriers in the heterostructure through the field effect when the gate structure is biased. While, as explained above, it may be unnecessary to provide the gate structure with a gate insulator layer if the heterostructure is adjoining the gate structure with a barrier layer, it may still be useful to implement the gate structure with a gate insulator layer in addition because this may increase the total insulator thickness between the channel layer facing the gate structure and the conductive material implemented in the gate structure to enable setting the gate structure to a desired voltage. A higher total insulator thickness may reduce the probability of leakage currents between gate and heterostructure and/or enable supplying the gate structure with a higher voltage.

According to an embodiment, the cell is disposed on a substrate and the heterostructure adjoins the substrate. This may increase the mechanical stability of the cell and provide the possibility to apply a back-gate voltage to the heterostructure, making the capacitorless DRAM cell a double-gate device.

According to an embodiment, one of the barrier layers is adjoining the substrate. In this way, the channel layer(s) of the heterostructure may be insulated from the substrate such that the buildup of back-gate currents may be prevented. It should be noted that, in this case of a barrier layer adjoining the substrate, it may be unnecessary to provide the substrate with a substrate insulator layer (e.g., a buried oxide layer) as this is often done in semiconductor-on-insulator (SOI) device manufacturing today. This may provide a simplification to the manufacturing process of the capacitorless DRAM cell. Furthermore, this may prevent or hinder charge carriers from spontaneously moving or tunneling out of the heterostructure into the substrate and/or spontaneous recombination with charge carriers from the substrate.

According to an embodiment, the substrate comprises a substrate insulator layer and the heterostructure adjoins the substrate insulator layer. A substrate insulator layer may be made of an electrical insulator such as an oxide, including, but not limited to, a buried oxide layer, and may prevent an exchange of charge carriers between the heterostructure and the substrate. This may be beneficial for implementing the substrate as a back gate structure to enable control of the charge carriers in the heterostructure through the field effect when the back gate structure is biased. While, as explained above, it may be unnecessary to provide the substrate with a substrate insulator layer if the heterostructure is adjoining the substrate with a barrier layer, it may still be useful, if the substrate implements a back gate structure, to implement the back gate structure with a gate insulator layer in addition because this may increase the total insulator thickness between the channel layer facing the back gate structure and the conductive material implemented in the back gate structure to enable setting the back gate structure to a desired voltage. A higher total insulator thickness may reduce the probability of leakage currents between back gate and heterostructure and/or enable supplying the back gate structure with a higher voltage.

According to an embodiment, the gate structure adjoins the heterostructure only in the first direction. This may enable to exert a more homogeneous, directed electrical field on the heterostructure if a voltage bias is applied to the gate structure. Hence, this may reduce the possibility of leakage currents due to charge carriers circumventing the barrier layer(s) because of field asymmetry.

According to an embodiment, the gate structure buries the heterostructure. This may prevent the gate structure from undercutting the heterostructure and thus increase the efficiency of charge carrier injection, retention and evacuation. In other words, the number and velocity of charge carriers may be increased during injection, the retention time of charge carriers in the heterostructure may be increased, and the evacuation of charge carriers from the heterostructure may be accelerated compared to a cell with a gate structure undercutting the heterostructure.

According to an embodiment, the gate structure is aligned with the heterostructure in the second direction and the direction opposite the second direction. This may prevent the gate structure from both undercutting the heterostructure and overlapping the source structure and/or the drain structure. While avoiding an undercutting gate structure may increase the efficiency of charge carrier injection, retention and evacuation as explained above, avoiding an overlapping gate structure may decrease the probability of influencing charge carriers in the source and/or drain regions by field effect, and may thus increase the drain-to-source current.

According to an embodiment, each of the channel layers and each of the barrier layers adjoin both the source structure and the drain structure. This may reduce the probability of leakage currents caused by charge carriers in the heterostructure circumventing the barrier layers.

According to an embodiment, each of the barrier layers is made of a barrier layer material that is selected, for each of the barrier layers, from the group consisting of silicon, silicon oxide, indium oxide, and indium phosphide. According to an embodiment, each of the channel layers is made of a channel layer material that is selected, for each of the channel layers, from the group consisting of indium arsenide, gallium arsenide, indium gallium arsenide, indium tin oxide, germanium, and silicon-germanium.

These materials may enable an efficient storage and transport of charge carriers in the heterostructure. It may be useful to adjoin chemically and/or crystallographically similar materials in the heterostructure to reduce the probability of defects in the crystal structure. In an illustrative example, the heterostructure comprises a channel layer made of indium gallium arsenide, adjoined by a barrier layer made of indium oxide, adjoined by a channel layer made of indium arsenide. It is emphasized that the capacitorless DRAM cell disclosed herein primarily relates to the structure of the cell and is generally material-agnostic.

According to an embodiment, the heterostructure has an overall length, measured in the second direction, between 1 nanometer and 75 nanometers. This dimensional range may enable operating the cell with a higher read/write cycle speed and/or lower voltages to be applied to the source, gate and/or drain structures, and may reduce the probability of electrostatic induction between source and drain.

According to an embodiment, the thickness of each channel layer measured in the first direction is between 1.5 and 5 times the thickness of each barrier layer measured in the first direction. This dimensional range may provide the channel layers with additional volume for storing charge carriers and may therefore increase the capacitance of the heterostructure. This may also result in an increased difference and/or ratio of the readout drain currents representing the '1' and '0' states of the cell.

Now turning to the drawings, FIG. 1 demonstrates the general principles of operation of a capacitorless DRAM cell. FIGS. 1a), b), d) and e) each show a schematic sectional view of a capacitorless DRAM cell 100. The cell 100 is formed on a substrate 102 and comprises a source structure 104, a channel structure 110, a drain structure 108, and a gate structure 106, 107. The source structure 104 and the drain structure 108 adjoin the channel structure 110. The source structure 104, the channel structure 110 and the drain structure 108 adjoin the substrate 102. The gate structure 106, 107 comprises a gate electrode 106 and a gate insulator 107 interfacing the gate electrode 106 and the channel structure 110. The source structure 104, the gate electrode 106, the drain structure 108 and the substrate 102 are electrically contacted by terminals for supplying a source voltage $V_S$ to the source structure 104, a front gate voltage $V_{FG}$ to the gate electrode 106, a drain voltage $V_D$ to the drain structure 108 and a back gate voltage $V_{BG}$ to the substrate 102.

Figure 1A:
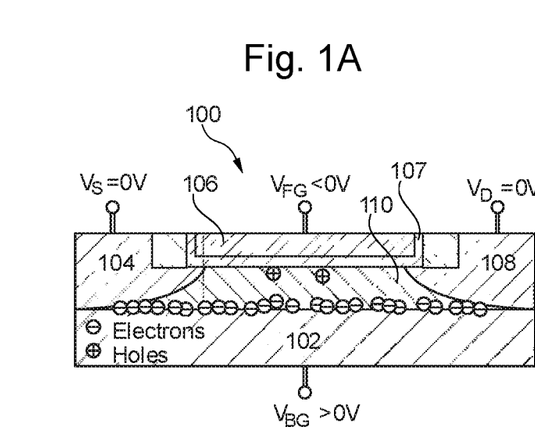
FIG. 1a) shows a schematic sectional view of a capacitorless DRAM cell storing logic state '0'.
Figure 1B:
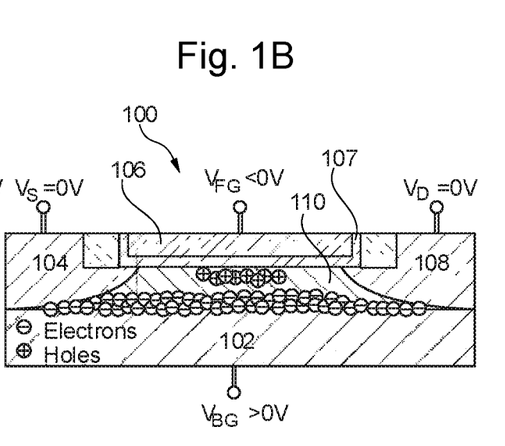
FIG. 1b) shows a schematic sectional view of a capacitorless DRAM cell storing logic state '1'.

The cell 100 is adapted for encoding the logic states '0' and '1' by capturing holes (illustrated as small circles labeled '+') in the channel structure 110. FIGS. 1a) and b)

each show the cell 100 in the 'hold' state where a combination of voltages $V_S=0$ V (volts), $V_{FG}<0$ V, $V_D=0$ V and $V_{BG}>0$ V is applied to keep the holes captured in the channel structure 110. The settings $V_{FG}<0$ V and $V_{BG}<0$ V ensure that the holes are collected near the gate insulator 107 and any electrons (illustrated as small circles labeled '-') are collected near the substrate 102. FIGS. 1a) and b) both show a significantly larger number of captured electrons compared to the number of captured holes. In the '0' state (FIG. 1a)) the number of holes is negligible compared to the number of electrons, while in the '1' state (FIG. 1b)) the numbers of holes and electrons are both increased. FIG. 1b) also illustrates that the electrons occupy a significant amount of volume of the channel structure 110 so the distributions of electrons and holes start to overlap.

Figure 1C:
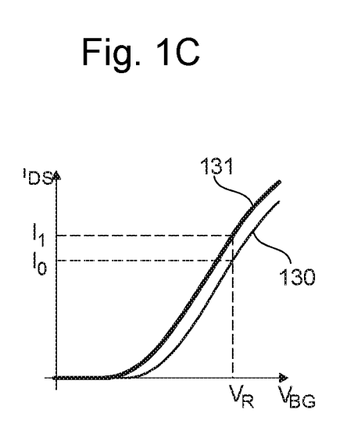
FIG. 1c) shows a diagram with two I-V curves of a capacitorless DRAM cell.

FIG. 1c) shows a diagram with two curves 130, 131 of the drain-to-source current IDs as a function of the applied back gate voltage $V_{BG}$. FIG. 1c) also shows the respectively measured currents that are observed when is $V_{BG}$ is set to a read voltage $V_R$. The measured current $I_{DS}=I_0$ of the curve 130 representing the '0' state is notably lower than the measured current $I_{DS}=I_1$ of the curve 131 representing the '1' state.

Figure 1D:
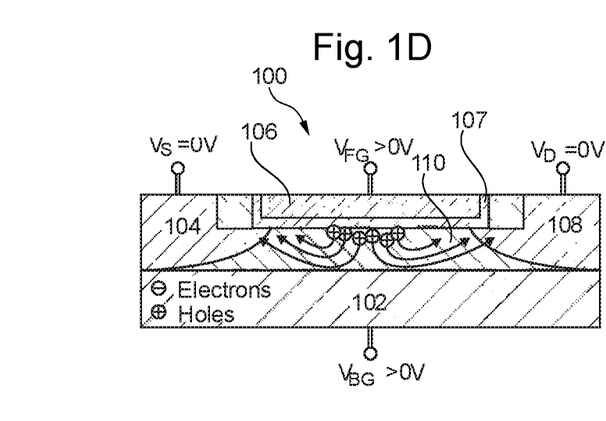
FIG. 1d) shows a schematic sectional view of a capacitorless DRAM cell during a write operation for logic state '0'.

FIGS. 1d) and e) show the cell 100 of FIGS. 1a) and b), but with different voltage combinations applied for programming the cell 100 either with the '0' state (FIG. 1d)) or the '1' state (FIG. 1e)). The electrons have been left out in FIGS. 1d) and e) for clarity reasons. The '0' state is written by setting $V_S=0$ V, $V_{FG}>0$ V, $V_D=0$ V and $V_{BG}>0$ V. The combination of $V_{FG}>0$ V with $V_{BG}>0$ V creates an attractive potential for electrons in the channel structure 110, allowing them to fill a major part of the channel structure 110 and recombine with any holes that may be present. Statistically, this corresponds to a lack of electrons at the boundaries of the channel structure 110 and in the source structure 104 and the drain structure 108, essentially outside of the electric field between the front gate structure 106, 107 and the substrate 102 acting as a back gate. Consequentially, the holes concentrate in the source structure 104 and the drain structure 108 (indicated by arrows in FIG. 1d)). In other words, the effect of the potential created inside of the channel structure 110 is equivalent to a repulsive potential if the holes were free charge carriers. Eventually, the '0' state is reached when the channel structure 110 is essentially depleted from holes.

Figure 1E:
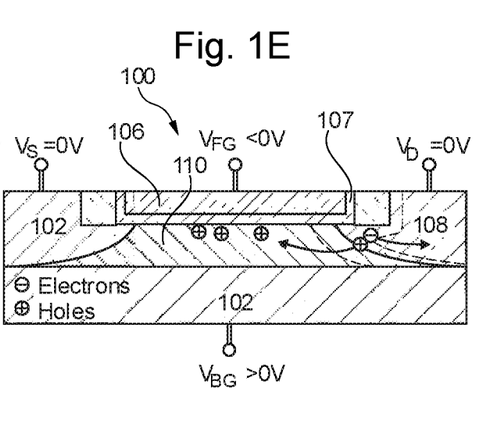
FIG. 1e) shows a schematic sectional view of a capacitorless DRAM cell during a write operation for logic state '1'.

FIG. 1e) illustrates the injection of holes into the channel structure 110 during a write operation for the logic state '1'. This state is programmed by setting the voltages to $V_S=0$ V, $V_{FG}<0$ V, $V_D>0$ V and $V_{BG}>0$ V. A depletion zone free of free charge carriers is indicated by two dashed lines paralleling the boundary between the drain structure 108 and the channel structure 110 in the lower part of the drawing. The combination of $V_{FG}<0$ V with $V_D>0$ V causes bound electrons in the depletion zone to leave their carrying atoms and tunnel into the conduction band of the drain structure 108 where $V_D>0$ V creates a potential that is attractive for electrons. Analogously, the holes left behind relocate into the channel structure 110 where they are captured due to the front gate voltage $V_{FG9}<0$ V. The carrier creation process is indicated by opposite arrows in the drawing. Eventually, the '1' state is reached when the hole density in the channel structure 110 reaches saturation, dynamic equilibrium or $V_D$ is set back to 0 V.

FIGS. 2-6 each show a schematic sectional view of an exemplary capacitorless DRAM cell 200. In each drawing, the depicted cell 200 comprises a heterostructure, a gate structure 106, 107 adjoining the heterostructure in a first direction, a drain structure 108 adjoining the heterostructure in a second direction perpendicular to the first direction, and a source structure adjoining 104 the heterostructure in the direction opposite the second direction. The heterostructure comprises one or more semiconducting channel layers 210, 310, 312, 410, 510, 610, 612 and one or more electrically insulating barrier layers 220, 320, 420, 520, 522, 620, 622, 624 in an alternatingly stacked arrangement. Without limitation, the specific examples depicted by FIGS. 2-6 show that the gate structure 106, 107 comprises a gate electrode 106 and a gate insulator layer 107 adjoining the heterostructure, and that the components of the cell 200 are provided on a substrate 102. The detailed implementation of the heterostructure varies between the drawings and is discussed in the following.

Figure 2:
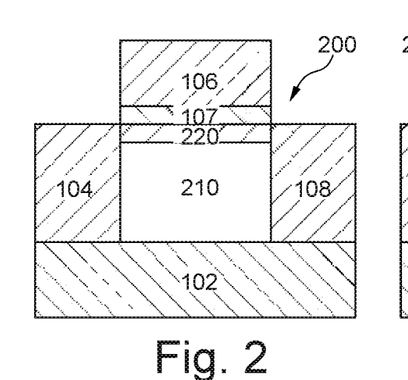
FIG. 2 shows a schematic sectional view of an exemplary capacitorless DRAM cell featuring a barrier layer interfacing a gate structure and a channel layer.

In FIG. 2, the heterostructure comprises one channel layer 210 and one barrier layer 220 interfacing the channel layer 210 and the gate insulator layer 107. The insulating effect of barrier layer 220 may impede or prevent charge carriers (electrons or holes) that may be present in channel layer 210 from leaving the channel layer 210 by moving or tunneling into the gate structure 106, 107. Hence, the utilization of one channel layer 210 with one barrier layer 220 adjoining the gate structure 106, 107 may result in an increased retention time for the charge carriers in the channel layer 210.

Figure 3:
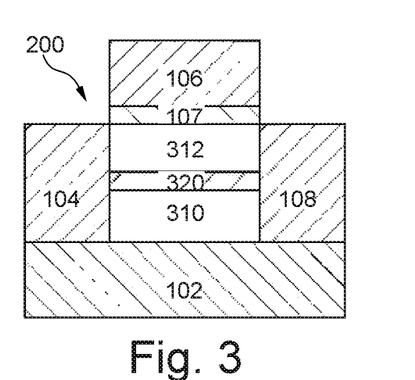
FIG. 3 shows a schematic sectional view of an exemplary capacitorless DRAM cell featuring a barrier layer interfacing two channel layers.

In FIG. 3, the heterostructure comprises two channel layers 310, 312 and one barrier layer 320 interfacing the channel layer 310 and the channel layer 312. The insulating effect of barrier layer 320 may impede or prevent charge carriers that may be present in channel layer 310 from leaving the channel layer 310 by moving into channel layer 312, may impede or prevent charge carriers that may be present in channel layer 312 from leaving the channel layer 312 by moving into channel layer 310, and may thus impede or prevent charge carriers that may be present in channel layer 310 from recombining with charge carriers of opposite charge that may be present in channel layer 312. Hence, the utilization of two channel layers 310, 312 with one barrier layer 320 may result in an increased retention time for the charge carriers in the channel layers 310, 312.

Figure 4:
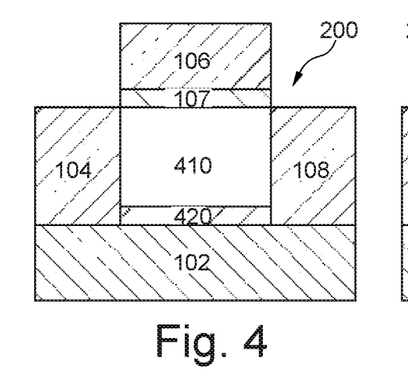
FIG. 4 shows a schematic sectional view of an exemplary capacitorless DRAM cell featuring a barrier layer interfacing a substrate and a channel layer.

In FIG. 4, the heterostructure comprises one channel layer 410 and one barrier layer 420 interfacing the channel layer 410 and the substrate 102. The insulating effect of barrier layer 420 may impede or prevent charge carriers that may be present in channel layer 410 from leaving the channel layer 410 by moving or tunneling into the substrate 102. Hence, the utilization of one channel layer 410 with one barrier layer 420 adjoining the substrate may result in an increased retention time for the charge carriers in the channel layer 410.

Figure 5:
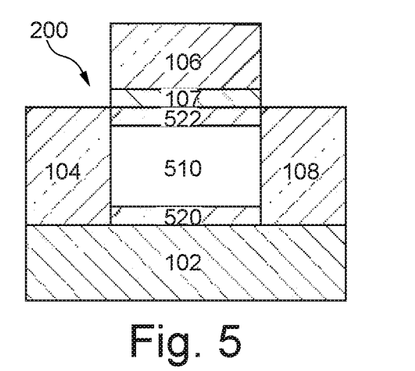
FIG. 5 shows a schematic sectional view of an exemplary capacitorless DRAM cell featuring two barrier layers and one channel layer.
Figure 6:
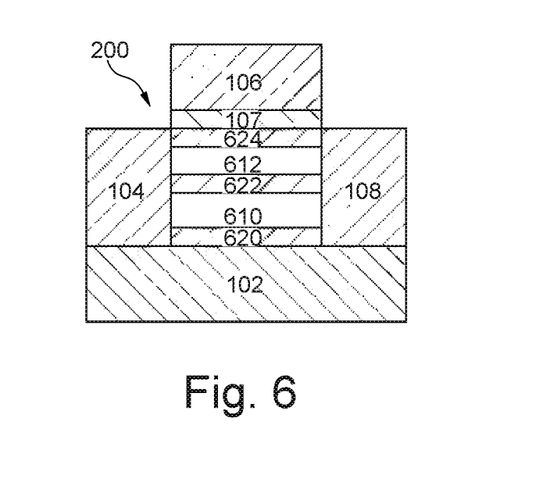
FIG. 6 shows a schematic sectional view of an exemplary capacitorless DRAM cell featuring three barrier layers and two channel layers.

In general, barrier layers implemented at different non-neighboring positions inside the heterostructure may be combined with each other. FIGS. 5 and 6 each show one of such possible combinations.

In FIG. 5, the heterostructure comprises one channel layer 510, one barrier layer 522 interfacing the channel layer 510 and the gate insulator layer 107, and one barrier layer 520 interfacing the channel layer 510 and the substrate 102. The insulating effect of barrier layer 522 may impede or prevent charge carriers that may be present in channel layer 510 from leaving the channel layer 510 by moving or tunneling into the gate structure 106, 107. Similarly, the insulating effect of barrier layer 520 may impede or prevent such charge carriers from leaving the channel layer 510 by moving or tunneling into the substrate 102. Hence, the utilization of one channel layer 510 with two barrier layers 520, 522 may result in an increased retention time for the charge carriers in the channel layer 510.

In FIG. 6, the heterostructure comprises two channel layers 610, 612, one barrier layer 624 interfacing the channel layer 612 and the gate insulator layer 107, one barrier layer 622 interfacing the channel layer 610 and the channel layer 612, and one barrier layer 620 interfacing the channel layer 610 and the substrate 102. The insulating effect of barrier layer 624 may impede or prevent charge carriers that may be present in channel layer 612 from leaving the channel layer 612 by moving or tunneling into the gate structure 106, 107. Similarly, the insulating effect of barrier layer 620 may impede or prevent such charge carriers from leaving the channel layer 610 by moving or tunneling into the substrate 102, and the insulating effect of barrier layer 622 may impede or prevent charge carriers that may be present in channel layer 610 from leaving the channel layer 610 by moving into channel layer 612, may impede or prevent charge carriers that may be present in channel layer 612 from leaving the channel layer 612 by moving into channel layer 610, and may thus impede or prevent charge carriers that may be present in channel layer 610 from recombining with charge carriers of opposite charge that may be present in channel layer 612. Hence, the utilization of two channel layers 610, 612 with three barrier layers 620, 622, 624 may result in an increased retention time for the charge carriers in the channel layers 610, 612.

Figure 7A:
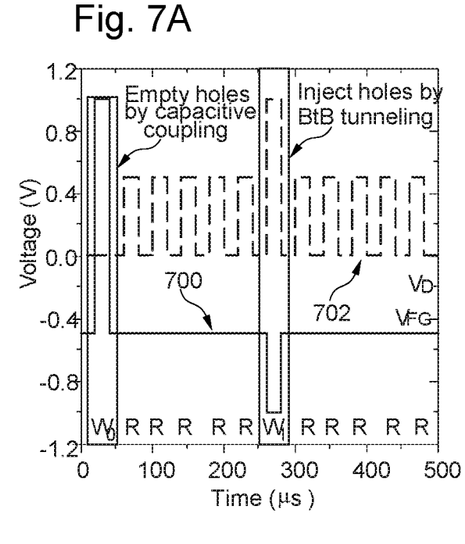
FIG. 7a) shows a diagram with two input signals for testing a capacitorless DRAM cell.

FIGS. 7a)-d) illustrate effects of the width and length of the channel structure 110 on the performance of the capacitorless DRAM cell 100 that were measured on prototypes implementing different dimensions of the channel structure 110. The length of the channel structure 110 is defined as an overall dimension of the channel structure 110 in the second direction, which may be equivalent to a distance between source structure 104 and gate structure 108. The width of the channel structure 110 is defined as an overall dimension of the channel structure 110 in a primary direction of longitudinal extension of the channel structure 110, which is perpendicular to the first direction and different from the second direction and, without limitation, may be perpendicular to the second direction.

FIG. 7a) shows a diagram with two input signals 700, 702 for testing a capacitorless DRAM cell. Curve 700 shows the front-gate voltage $V_{FG}$ as a function of time and curve 702 shows the drain voltage $V_D$ as a function of time. Both curves 700, 702 show a sequence of rectangular pulses with a cycle time of about 40 microseconds (µs). Each pulse displaces the respective voltage from a specific bias level to a temporary, constant pulse voltage level with a time duty of about 50%. Bias levels are −0.5 V (volts) for $V_{FG}$ and 0.0 V for $V_D$.

In the first cycle, labeled 'W$_0$' for 'write 0', $V_{FG}$ rises to +1.0 V and $V_D$ stays on bias level. This causes an evacuation of the holes from the channel structure 110 such that the logic state '0' is prepared. In cycles 2-6, labeled 'R' for 'read', $V_{FG}$ stays on bias level and $V_D$ rises to +0.5 V. This enables five cycles of readout of the current state of cell 100 by measuring the drain current. In cycle 7, labeled 'W$_1$' for 'write 1', $V_{FG}$ drops to −1.0 V and $V_D$ rises to +1.0 V. This causes an injection of holes into the channel structure 110 such that the logic state '1' is prepared. Cycles 8-12 are five further read cycles labeled 'R' with the same properties as cycles 2-6. This enables a comparative observation of the time development of the drain current response to the programming cycles W$_0$ and W$_1$.

Figure 7B:
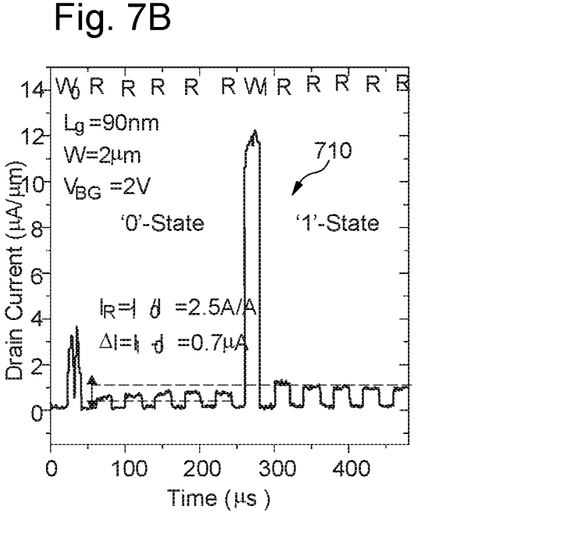
FIGS. 7b)-d) each show a diagram of an output signal of a capacitorless DRAM cell in response to receiving two input signals for testing.
Figure 7C:
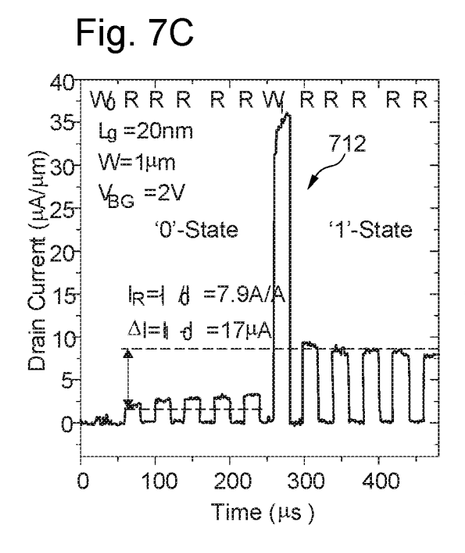
Figure 7D:
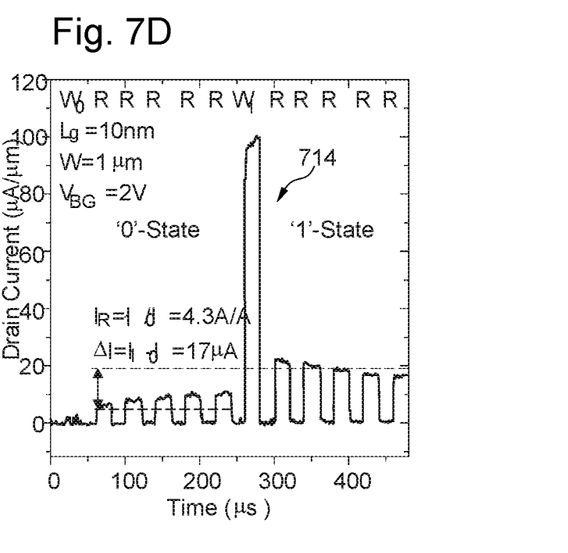

FIG. 7b)-d) each show the drain current response of a specific capacitorless DRAM cell prototype that was tested using the signals 700, 702 as input signals. All measurements were conducted with a back gate voltage of $V_{BG}$=2.0 V.

The prototype used for the measurement of FIG. 7b) implemented a nominal channel length (equivalent to the gate length $L_g$) of 90 nanometers (nm) and a channel width W of 2 micrometers (µm). The responses of the drain current $I_D$ (curve 710) in the '0' state and in the '1' state differ by $\Delta_I I_1 - I_0 = 0.7$ µA (microamperes) and have a ratio $I_R/I_0 = 2.5$. The prototype used for the measurement of FIG. 7c) implemented a nominal channel length $L_g$=20 nm and a channel width W of 1 µm. The responses of the drain current $I_D$ (curve 712) in the '0' state and in the '1' state differ by $\Delta_I$=17 µA and have a ratio $I_R$=7.9. The prototype used for the measurement of FIG. 7d) implemented a nominal channel length $L_g$=10 nm and a channel width W of 1 µm. The responses of the drain current $I_D$ (curve 714) in the '0' state and in the '1' state differ by $\Delta_I$=17 µA and have a ratio $I_R$=4.3.

Figure 8:
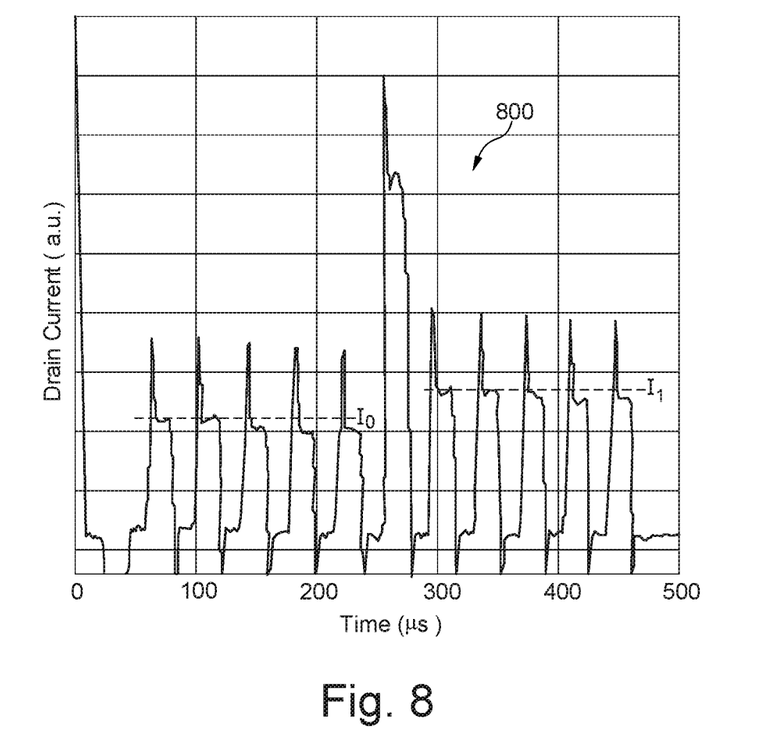
FIG. 8 shows the drain current response of a capacitorless DRAM cell that was tested using two input signals.

FIG. 8 shows the drain current response of a capacitorless DRAM cell 200 that was tested using the signals 700, 702 as input signals. The prototype used for the measurement of FIG. 8 implemented a heterostructure comprising one channel layer 410 and two barrier layers 420, 422. A comparison of the time development of the drain current ID (curve 800) during the five repeated read cycles in each logic state (i.e., $I_D=I_0$ in logic state '0' and $I_D=I_1$ in logic state '1') to the respective time developments observed in FIGS. 7b)-d) shows that the read current levels of curve 800 have greater relaxation time constants of spontaneous charge carrier capture or loss, respectively, than those of curves 710, 712, 714.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

In the following, the invention will be described again by a list of clauses highlighting several possible, non-exclusive combinations of features disclosed herein:

1. A capacitorless DRAM cell, the cell comprising a heterostructure, a gate structure adjoining the heterostructure in a first direction, a drain structure adjoining the heterostructure in a second direction perpendicular to the first direction, and a source structure adjoining the heterostructure in the direction opposite the second direction, the heterostructure comprising one or more semiconducting channel layers and one or more electrically insulating barrier layers, the channel layers and the barrier layers being alternatingly stacked in the first direction.
2. The DRAM cell of clause 1, the heterostructure comprising a single barrier layer and a single channel layer.
3. The DRAM cell of clause 1, the heterostructure comprising a single barrier layer and two channel layers.
4. The DRAM cell of clause 1, the heterostructure comprising two barrier layers and a single channel layer.
5. The DRAM cell of clause 1, the heterostructure comprising two barrier layers and two channel layers.

6. The DRAM cell of clause 1, the heterostructure comprising three barrier layers and two channel layers.
7. The DRAM cell of any of the previous clauses, the heterostructure comprising at least two barrier layers being made of different barrier layer materials.
8. The DRAM cell of any of the previous clauses, the heterostructure comprising at least two channel layers being made of different channel layer materials.
9. The DRAM cell of clause 8, the different channel layer materials differing in band gap energy by at least 0.5 electronvolts.
10. The DRAM cell of clause 8 or 9, the different channel layer materials differing in electron mobility by at least a factor of 10.
11. The DRAM cell of any of the previous clauses, wherein the gate structure is adjoining one of the barrier layers.
12. The DRAM cell of clause 11, the gate structure comprising a gate insulator layer adjoining the barrier layer.
13. The DRAM cell of any of the previous clauses, the cell being disposed on a substrate, the heterostructure adjoining the substrate.
14. The DRAM cell of clause 13, the substrate comprising a substrate insulator layer, the heterostructure adjoining the substrate insulator layer.
15. The DRAM cell of clause 13 or 14, wherein one of the barrier layers is adjoining the substrate.
16. The DRAM cell of any of the previous clauses, the gate structure adjoining the heterostructure only in the first direction.
17. The DRAM cell of any of the previous clauses, the gate structure burying the heterostructure.
18. The DRAM cell of clause 17, the gate structure being aligned with the heterostructure in the second direction and the direction opposite the second direction.
19. The DRAM cell of any of the previous clauses, each of the channel layers and each of the barrier layers adjoining both the source structure and the drain structure.
20. The DRAM cell of any of the previous clauses, each of the barrier layers being made of a barrier layer material, the barrier layer material being selected, for each of the barrier layers, from the group consisting of silicon, silicon oxide, indium oxide, and indium phosphide.
21. The DRAM cell of any of the previous clauses, each of the channel layers being made of a channel layer material, the channel layer material being selected, for each of the channel layers, from the group consisting of indium arsenide, gallium arsenide, indium gallium arsenide, indium tin oxide, germanium, and silicon-germanium.
22. The DRAM cell of any of the previous clauses, the heterostructure having an overall length, measured in the second direction, between 1 nanometer and 75 nanometers.
23. The DRAM cell of any of the previous clauses, the overall width of the heterostructure measured in a third direction perpendicular to the first direction and the second direction being between 20 and 200 times the overall length of the heterostructure measured in the second direction.
24. The DRAM cell of any of the previous clauses, the thickness of each channel layer measured in the first direction being between 1.5 and 5 times the thickness of each barrier layer measured in the first direction.
25. A method of manufacturing a capacitorless DRAM cell, the method comprising:
    forming a heterostructure, the heterostructure comprising one or more semiconducting channel layers and one or more electrically insulating barrier layers, the channel layers and the barrier layers being alternatingly stacked in a first direction;
    forming a gate structure adjoining the heterostructure in the first direction;
    forming a drain structure adjoining the heterostructure in a second direction perpendicular to the first direction; and
    forming a source structure adjoining the heterostructure in the direction opposite the second direction.

The invention claimed is:
1. A capacitorless DRAM cell, the cell comprising:
    a heterostructure comprising one or more semiconducting channel layers and one or more electrically insulating barrier layers, wherein the channel layers and the barrier layers are alternatingly stacked in a first direction;
    a gate structure adjoining the heterostructure in the first direction, wherein the gate structure buries the heterostructure;
    a drain structure adjoining the heterostructure in a second direction perpendicular to the first direction; and
    a source structure adjoining the heterostructure in a direction opposite the second direction.
2. The DRAM cell of claim 1, wherein the heterostructure comprises a single barrier layer and a single channel layer.
3. The DRAM cell of claim 1, wherein the heterostructure comprises two barrier layers and a single channel layer.
4. The DRAM cell of claim 1, wherein the heterostructure comprises two barrier layers and two channel layers.
5. The DRAM cell of claim 1, wherein the heterostructure comprises three barrier layers and two channel layers.
6. The DRAM cell of claim 1, wherein the heterostructure comprises at least two barrier layers, wherein each barrier layer is made of a different material.
7. The DRAM cell of claim 1, wherein the heterostructure comprises at least two channel layers, wherein each channel layer is made of a different material.
8. The DRAM cell of claim 7, wherein the different channel layer materials differ in band gap energy by at least 0.5 electronvolts.
9. The DRAM cell of claim 7, wherein the different channel layer materials differ in electron mobility by at least a factor of 10.
10. The DRAM cell of claim 1, wherein the gate structure adjoins one of the barrier layers.
11. The DRAM cell of claim 10, wherein the gate structure comprises a gate insulator layer adjoining the barrier layer.
12. The DRAM cell of claim 1, wherein the cell is disposed on a substrate, and wherein the heterostructure adjoins the substrate.
13. The DRAM cell of claim 12, wherein the substrate comprises a substrate insulator layer, and wherein the heterostructure adjoins the substrate insulator layer.
14. The DRAM cell of claim 12, wherein one of the barrier layers adjoins the substrate.
15. The DRAM cell of claim 1, wherein the gate structure adjoins the heterostructure only in the first direction.
16. The DRAM cell of claim 1, wherein the gate structure is aligned with the heterostructure in the second direction.

17. The DRAM cell of claim 1, wherein each of the channel layers and each of the barrier layers adjoin both the source structure and the drain structure.

18. The DRAM cell of claim 1, the heterostructure having an overall length, measured in the second direction, between 1 nanometer and 75 nanometers.

19. The DRAM cell of claim 1, the overall width of the heterostructure measured in a third direction perpendicular to the first direction and the second direction being between 20 and 200 times the overall length of the heterostructure measured in the second direction.

20. The DRAM cell of claim 1, the thickness of each channel layer measured in the first direction being between 1.5 and 5 times the thickness of each barrier layer measured in the first direction.

* * * * *